United States Patent [19]

Huijsing

[11] Patent Number: 4,890,489
[45] Date of Patent: Jan. 2, 1990

[54] DIRECTION-SENSITIVE FLOW-RATE INDICATOR

[75] Inventor: Johan H. Huijsing, Schipluiden, Netherlands

[73] Assignee: Bronkhorst High-Tech B.V., Vorden, Netherlands

[21] Appl. No.: 245,769

[22] Filed: Sep. 16, 1988

[30] Foreign Application Priority Data

Sep. 18, 1987 [NL] Netherlands ............... 8702229

[51] Int. Cl.⁴ ............................................ G01F 1/68
[52] U.S. Cl. .................................... 73/204.24; 73/189
[58] Field of Search .................. 73/189, 204.24, 188

[56] References Cited

U.S. PATENT DOCUMENTS

| 4,332,157 | 6/1982 | Zemel et al. | 73/204.23 |
| 4,373,386 | 2/1983 | Schuddemat et al. | 73/204.23 |
| 4,561,303 | 12/1985 | McCarthy | 73/204.24 |
| 4,637,253 | 1/1987 | Sekimura et al. | 73/189 |

Primary Examiner—Herbert Goldstein
Attorney, Agent, or Firm—Rosen, Dainow & Jacobs

[57] ABSTRACT

A direction-sensitive flow velocity meter in which at least first and second thermocouples of the Seebeck type are arranged in a symmetrical layout in a common semiconductor substrate. The configuration is such that imaginary lines joining the junction ends of the thermocouples each extend parallel to perpendicular flow velocity components, with the heating element or electronic circuitry for processing the thermocouple voltages being integrated into the common substrate at surface areas free of the thermocouples.

5 Claims, 1 Drawing Sheet

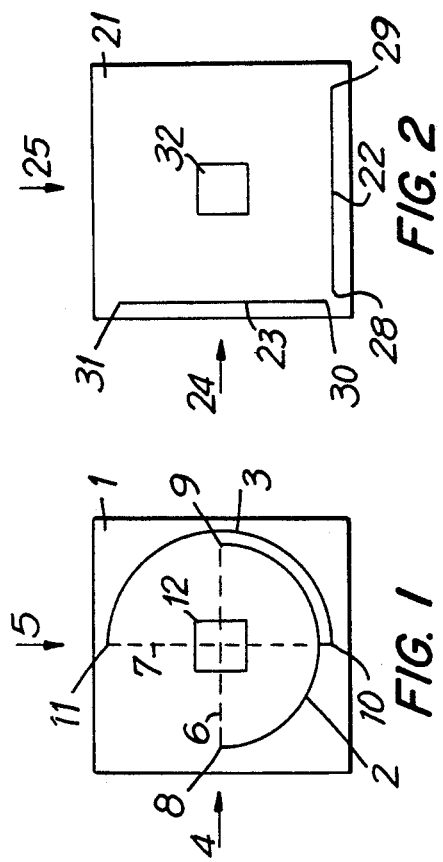
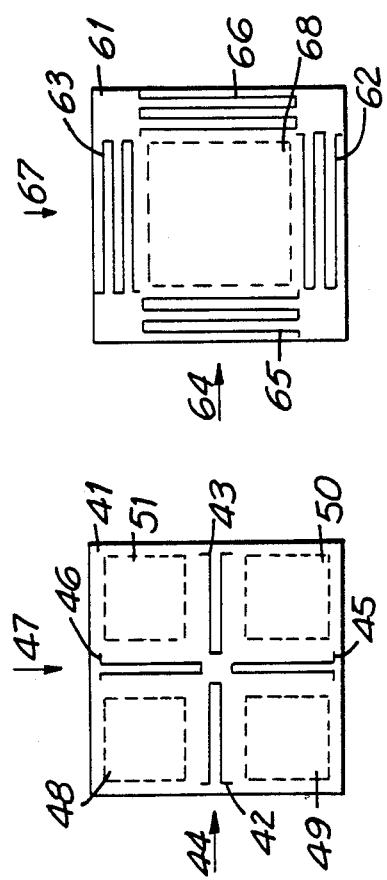

DIRECTION-SENSITIVE FLOW-RATE INDICATOR

The invention relates to a direction-sensitive flow-rate indicator for gaseous or liquid media which comprises a semi-conductor substrate on which at least one thermocouple is arranged, in which an imaginary line connecting the ends of the said one or each thermocouple extends in the direction-of-flow component of the medium, and a heating-element for generating a flow-rate dependent temperature-difference in the flowing medium in the longitudinal direction of the said thermocouple(s) which results in a flow-rate dependent thermo-voltage between the ends of the said one or each thermocouple.

Such a direction-sensitive flow-rate indicator is known from U.S. patent specification No. 4,373,386. In this specification, the thermocouple comprises two metal conducting strips which are bonded to one end of two parallel running strips which are insulated from one another, one of which strips is a P-type semiconductor and the other of which strips is an N-type semiconductor and, in which both said semiconductor strips are bonded together at their other end by a metal layer therebetween. The P-type and Ntype semiconductor regions at the strip ends each form metal-semiconductor junctions with the overlying metal. A heating-element is arranged on each side of these strips and radiates the heat generated thereby to the medium flowing over the thermocouple. Through this there arises a temperature-difference between both ends of the semi-conducting strips and through which the voltage-changes between the semi-conductor strips and the metal layer and metal strips respectively are different and so that a thermo-voltage arises between the metal strips dependent on the rate-of-flow of the medium. Due to the passive nature of the thermocouple, the voltage is always zero when the temperatures of the ends are the same, that is to say no "offsetting" can occur. In order to measure the rate-of-flow in a direction different to the thermocouple's longitudinal direction, two separate substrates are used.

According to a first characterising feature of the invention, at least one thermocouple is provided for each dimension in a two-dimensional embodiment of the invention and the lines joining the ends of the one or each thermocouple are arranged perpendicular alongside each other. The advantage of this arrangement is that only one substrate is needed and through which the design is very simple. In addition hereto, the application of conducting-paths for connecting the thermocouples is made considerably easier since they are now located on a single substrate.

The thermocouple between the two ends can be of an arbitrary form; here the thermocouple output-voltage will only be determined by the temperature difference between these ends, thus the thermocouple can be of a semi-circular form for example and such that the radius-of-curvature is at least partially concentric provided that the temperature-difference between the ends at a zero rate-of-flow is also equal to zero. It is also possible to arrange each of the thermocouples along one of two perpendicularly lying edges of a preferably square substrate.

In a second characterising feature of the direction-sensitive flow-rate indicator according to the invention, the ends of each thermocouple are arranged along an edge of a semi-conductor substrate. Here the flowing medium cools off the most strongly and through which the temperature-difference between the ends of the thermoscouples is greatest and thus the voltage of the thermocouples also.

In a third characterising feature of the direction-sensitiive flow-rate indicator according to the invention at least one thermocouple is provided and in which the one or each thermocouple is comprises two parts which are connected in line to one another and which can be connected in series, and in which for both dimensions, like thermocouples are arranged on the substrate in a cruciform manner. This provides a two-sided symmetrical arrangement with like properties for both rate-of-flow components.

In a fourth characterising feature of the direction-sensitive flow-rate indicaator according to the invention, two preferably alike thermocouples are provided for each dimension and each of which thermocouples extend parallel to one another and can be connected in series such that they form an enclosed rectangle therebetween. The advantage of this arrangement is that a double-sidedly symmetrical arrangement is obtained with like properties for both rate-of-flow components with one large area free for applying the conducting-paths and other components.

In a fourth characterising feature of the direction-sensitive flow-rate indicator according to the invention, heating-elements are arranged on the thermocouple-free surface of the semiconductor substrate. Such a heating element can for example comprise a transistor or an integrated passive-resistor.

In a fifth characterising feature of the direction-sensitive flow-rate indicator according to the invention, the heating-elements can be arranged symmetrically on the semiconductor substrate with respect to its centre point. Through this arrangement, a double-sidedly symmetrical heat distribution over the semiconductor substrate is achieved with a zero rate-of-flow and through which the output voltages of the thermocouples are also zero.

In a sixth characterising feature of the direction-sensitive flow-rate indicator according to the invention, at least two heating-elements are enclosed in the quadrants formed by cruciformly arranged thermocouples.

In a seventh characterising feature of the direction-sensitive flow-rate indicator according to the invention, at least one heating-element is arranged within the rectangle. As a result hereof, the symmetry of both rate-of-flow components is still further improved and component connections still even simpler.

In an eighth characterising feature of the direction-sensitive flow-rate indicator according to the invention, each thermocouple is in the form of a thermo-column each comprising a number of series-connected thermocouples the output-signal from which is an equal number of times higher and thus the sensitivity of the indicator also.

In a ninth characterising feature of the direction-sensitive air-flow indicator according to the invention, the electronic-circuitry and other items for the processing of the thermocouple voltages and/or supply for the heating-elements are either partially or completely arranged on the thermocouple-free surfaces of the substrate. The result of this arrangement is a very compact integrated air-flow indicator which can be mass produced with an output-signal which can be connected to a standard interface.

The invention is now to be further described with reference to the accompanying figures in which:

FIG. 1 is a semiconductor substrate with an arbitrary arrangement of thermocouples thereon.

FIG. 2 is a semiconductor substrate with straight thermocouples arranged along the edges of the substrate.

FIG. 3 is a semiconductor substrate with cruciformly arranged thermocouples thereon.

FIG. 4 is a semiconductor substrate with thermocouples forming the sides of a rectangle thereon and FIG. 5 shows the construction of a thermo-column.

Referring now to FIG. 1, two thermocouples 2 and 3 are arranged on the semiconductor substrate 1 for flow-direction components 4 and 5, imaginary lines of the ends 6 and 7 of which are arranged perpendicular to one another whilst the junctions ends 8, 9, 10 and 11 of each thermocouple are located at the edge of the semiconductor substrate 1. The form taken by these thermocouples is substantially that of a semi-circle although they can assume any arbitrary form such that the final voltage is only determined by the temperature-difference between the junction ends 8 and 9, 10 and 11 respectively. These thermocouples are preferably integrated in the semi-conductor substrates as P and N doped strips which are bonded or contacted at each end by metal conductors of non-evaporised aluminium. In this embodiment, the heating-element 12 is arranged in the centre of the semiconductor substrate 1 whilst the remaining space is available for accommodating the electronic-circuitry for processing the thermocouple voltages. The conducting paths connecting the components are also arranged on the substrate 1 in this remaining space whilst one or more edges are provided with the necessary connecting terminals.

In FIG. 2, the thermocouples 22 and 23 for the flow components 22 and 23 are arranged on the semiconductor substrate 1. Here these thermocouples are of a straight form and arranged along the edges of the the semiconductor substrate 1 whilst the junction ends 28 and 29, 30 and 31 respecttively are also naturally located on the semiconductor at the edges particular thereto. The heating-element 32 is located in the centre of the semicònductor substrate 21 whilst the remaining space is again available for applying the electronic-circuitry.

FIG. 3 shows two parts 42 and 43 of a thermocouple arranged in line with one another on semiconductor substrate 41 and which relate to he rate-of-flow component 44 and two parts 45 and 46 of a thermocouple also arranged in prolongation and which relate to the rate-of-flow component 47. Heating-elements 42, 43, 44 and 45 are arranged along thhe sides of the thermocouples in quadrants 48, 49, 50 and 51 for heating the flowing medium whilst the necessary electronic-circuitry is also located here.

FIG. 4 shows a semiconductor substrate 61 on which, for each dimension or direction component 64 and 67, there are arranged two thermocouples 62 and 63 and 65 and 66 of thermo-pile form lying parallel with one another whilst the surface 68 between thermocouples 62, 63, 65 and 66 can be used for accommodating one or more heating-elements and electronic-circuitry for the processing of thermocouple output signals and in which the heat generated by the circuitry can partially or completely replace the heat generated by the heating-elements.

Finally, FIG. 5 shows how a number of thermocouples can be arranged to form a thermo-pile. The thermocouples are formed by series-connecting a number of semiconductor strips 71 and 72 which are electrically-insulated from one another in a silicon layer and connected by means of aluminium conductors 73, 74 and 75.

In the various embodiments described, the electrical construction is the same as that described in the referenced U.S. Pat. No. 4,373,386. In particular, each thermocouple is an N or P type semiconductor strip isolated from the underlying semiconductor substrate material, and forming at their ends a metalsemiconductor active junction with metal conductors contacting the ends of each thermocouple. The signal voltages are taken from across the contacted ends of each thermocouple and processed in the integrated electronic circuitry provided in the common substrate. In the embodiments of FIGS. 1, 3 and 4, the imaginary lines (for examples 6 and 7 in FIG. 1) are arranged symmetrically with respect to first and second mutually perpendicular axes of symmetry of the thermocouple arrangement.

What we claim is:

1. In a direction-sensitive flow velocity meter for gaseous or liquid media comprising a single semiconductor substrate on which a first thermocouple is arranged, said first thermocouple comprising a strip of a first conductive material connected at its two ends with two strips of a second conductive material so as to form two junctions of said thermocouple, an imaginary line through said junctions of said first thermocouple extending parallel to the direction of a first flow velocity component of the medium, and a heating element for generating a flow velocity dependent temperature difference in the flowing medium in the direction of said imaginary line resulting in a flow velocity dependent thermo-voltage between the junctions ends of the said first thermocouple, the improvement comprising at least one second thermocouple, substantially similar to the first, arranged in the single substrate such that an imaginary line through its junction ends extends parallel to the direction of a second flow velocity component of the medium, said direction of the second flow velocity component being perpendicular to the direction of the first flow velocity component, said imaginary lines through the junction ends of the first and second thermocouples being symmetrically arranged on the single substrate with respect to first and second mutually perpendicular axes of symmetry respectively, and electronic means for processing the thermocouple voltages or supplying the heating element being arranged on thermocouple-free surfaces of the substrate between said thermocouples.

2. A direction-sensitive flow velocity meter as claimed in claim 1, wherein each thermocouple for the direction of said first and second flow velocity components extends along the corresponding axis of symmetry and comprises two parts arranged in line and connected in series.

3. A direction-sensitive flow velocity meter as claimed to claim 1, wherein, for each of said perpendicular components of the flow velocity, two substantially alike thermocouples are symmetrically arranged with respect to their corresponding axis at some distance therefrom and are connected in series.

4. A direction-sensitive flow velocity meter as claimed in claim 2 or 3, wherein the heating elements are symmetrically arranged on the thermocouple-free surfaces of the semiconductor substrate.

5. A direction-sensitive flow velocity meter as claimed in claim 2 or 3, wherein each of said thermocouples is in the form of a thermo-pile, each thermo-pile comprising a number of series-connected thermocouples the voltage output from which is an equal number of times higher than the output of one single thermocouple.

* * * * *